United States Patent
Lee et al.

(10) Patent No.: US 10,312,870 B2
(45) Date of Patent: Jun. 4, 2019

(54) WIRELESS SIGNAL PROCESSING METHOD AND WIRELESS DEVICE

(71) Applicant: REALTEK SEMICONDUCTOR CORPORATION, Hsinchu (TW)

(72) Inventors: Shen-Chung Lee, Taoyuan (TW); Wei-Hsuan Chang, Hsinchu (TW); Chifang Chang, Taichung (TW); Chenpeng Wen, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/869,640

(22) Filed: Jan. 12, 2018

(65) Prior Publication Data
US 2018/0241361 A1 Aug. 23, 2018

(30) Foreign Application Priority Data

Feb. 22, 2017 (TW) .............................. 106106003 A

(51) Int. Cl.
| | |
|---|---|
| *H03F 3/189* | (2006.01) |
| *H04W 24/04* | (2009.01) |
| *H04L 5/00* | (2006.01) |
| *H03G 3/30* | (2006.01) |
| *H04B 1/707* | (2011.01) |

(Continued)

(52) U.S. Cl.
CPC ........... *H03F 3/189* (2013.01); *H03G 3/3078* (2013.01); *H04L 5/0007* (2013.01); *H04W 24/04* (2013.01); *H04B 1/707* (2013.01); *H04J 2011/0009* (2013.01); *H04L 25/00* (2013.01)

(58) Field of Classification Search
CPC ...... H03F 3/189; H04L 5/0007; H04W 24/04; H04J 2011/0009; H04B 1/707
See application file for complete search history.

(56) References Cited

U.S. PATENT DOCUMENTS

| 8,913,697 B2 | 12/2014 | Hsin et al. |
| 2005/0059364 A1 | 3/2005 | Hansen et al. |

(Continued)

FOREIGN PATENT DOCUMENTS

| TW | I474639 | 2/2015 |

OTHER PUBLICATIONS

Taiwan Patent Office "Office Action" dated May 15, 2018, Taiwan. OA letter. Summary of the OA letter: 1. Reference 1 (TW I474639) renders claims 1, 5 obvious. 2. References 1(TW I474639) and 2 (US2005059364A1) render claims 6, 8, 9 obvious.

(Continued)

*Primary Examiner* — Vineeta S Panwalkar
(74) *Attorney, Agent, or Firm* — WPAT, PC

(57) ABSTRACT

A method for processing wireless signals and a wireless device are disclosed. The method for processing wireless signals is applied to the wireless device that includes an amplifier circuit amplifying wireless signals according to a base gain. The method for processing wireless signals includes steps of: setting the base gain as a first gain value in a first operation period; performing multiple packet detections in the first operation period and counting a total number of false alarms; determining a second gain value according to the total number of false alarms; and setting the base gain as a second gain value in a second operation period that is later than the first operation period.

16 Claims, 10 Drawing Sheets

(51) Int. Cl.
*H04J 11/00* (2006.01)
*H04L 25/00* (2006.01)

(56) References Cited

U.S. PATENT DOCUMENTS

| | | | | |
|---|---|---|---|---|
| 2007/0129034 A1* | 6/2007 | Adams | ............... | H03G 3/3068 |
| | | | | 455/138 |
| 2007/0211645 A1* | 9/2007 | Tachibana | ............... | H04L 43/00 |
| | | | | 370/252 |
| 2010/0067623 A1* | 3/2010 | Sankabathula | ...... | H03G 3/3052 |
| | | | | 375/345 |
| 2012/0155347 A1* | 6/2012 | Husted | .............. | H04W 52/0229 |
| | | | | 370/311 |

OTHER PUBLICATIONS

Taiwan Patent Office "Office Action" dated May 15, 2018, Taiwan.

* cited by examiner

WIRELESS SIGNAL PROCESSING METHOD AND WIRELESS DEVICE

BACKGROUND

1. Field of the Disclosure

The present disclosure generally relates to a wireless communication system, and, more particularly, to a wireless signal processing method and a wireless device.

2. Description of Related Art

In a wireless communication system, after receiving a wireless signal, a wireless device first down-converts the wireless signal from the radio frequency to the baseband, and then performs packet detections. For orthogonal frequency-division multiplexing (OFDM) technology, common packet detection approaches include matched filtering, delay correlation, and power calculation, all of which distinguish the packets to be received from noises by setting a threshold value. When the detection value generated by the packet detection approach is greater than the threshold value, the signal receiving end determines that the current wireless signal contains the packet to be received. On the contrary, when the detection value is smaller than the threshold value, the signal receiving end determines that the current wireless signal is noise. If the threshold value is set too high, packet misdetections are likely to happen; if the threshold value is set too low, false alarms may increase. A false alarm is issued when the preamble data of a packet contain a field that a wireless device receiving that packet is expecting and/or able to identify, or when an error occurs as the wireless device performs error correction (e.g., parity check or cyclic redundancy code (CRC) check) on that packet. Whenever a false alarm is issued, a wireless device has detected and received a packet but failed to identify or process (e.g., demodulate, decode) that packet. In other words, the issue of a false alarm means the hardware of the wireless device is occupied, preventing authentic packets that the wireless device can identify and process from being received and processed. Raising the threshold value can reduce the false alarm rate, but unfortunately increases the probability of packet misdetection.

Furthermore, the conventional wireless communication system must also deal with the problem that there is no standard in the signal transmission technologies and the physical layer technologies. For example, Wi-Fi systems for wireless networks include direct-sequence spread spectrum (DSSS) technology and orthogonal frequency division multiplexing (OFDM) technology. Since the threshold value suitable for one of the signal transmission technologies or one of the physical layer technologies does not necessarily apply to another, it becomes more challenging to ensure the Quality of Service (QoS) with an ideal threshold value for each user in a multi-STA scenario. The foregoing issues cause lots of difficulties in the circuit design for baseband packet detections.

SUMMARY OF THE DISCLOSURE

In view of the issues of the prior art, an object of the present disclosure is to provide a wireless signal processing method and a wireless device, so as to make an improvement to the prior art.

A wireless signal processing method is provided. The wireless signal processing method is used in a wireless device including an amplifier circuit that amplifies a wireless signal according to a base gain. The method including the following steps: setting the base gain as a first gain value in a first operation period; performing multiple packet detection processes in the first operation period and counting a total number of false alarms; determining a second gain value according to the total number of false alarms; and setting the base gain as the second gain value in a second operation period that is later than the first operation period.

A wireless device is also provided. The wireless device receives a wireless signal and includes an amplifier circuit, a down-conversion circuit, and a baseband circuit. The amplifier circuit amplifies the wireless signal according to a base gain. The down-conversion circuit, which is coupled to the amplifier circuit, down-converts the wireless signal. The baseband circuit, which is coupled to the amplifier circuit and the down-conversion circuit, includes a storage unit and a computing unit. The storage unit stores a set of program instructions. The computing unit, which is coupled to the storage unit, executes the set of program instructions to perform the following operations: setting the base gain as a first gain value in a first operation period; performing multiple packet detection processes in the first operation period and counting a total number of false alarms; determining a second gain value according to the total number of false alarms; and setting the base gain as the second gain value in a second operation period that is later than the first operation period.

A wireless signal processing method is also provided. The wireless signal processing method is used in a wireless device and includes the following steps: setting a base gain as a first gain value in a first operation period; amplifying a wireless signal according to the base gain prior to a packet detection process; down-converting the wireless signal to generate a baseband signal; performing the packet detection process on the baseband signal in the first operation period; and setting the base gain as a second gain value in a second operation period, wherein, the second gain value is not equal to the first gain value, and the second operation period is later than the first operation period.

In this disclosure, the wireless signal processing method and the wireless device lower the false alarm probability (FAP) while maintaining the QoS by filtering signals in the radio frequency domain rather than the baseband domain. Compared with the conventional technology, this disclosure can be applied to a variety of signal transmission technologies and physical layer technologies.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a wireless signal processing method and a wireless device. On account of that some or all elements of the wireless could be known, the detail of such elements is omitted provided that such detail has little to do with the features of this disclosure and this omission nowhere dissatisfies the specification and enablement requirements. Some or all of the processes of wireless signal processing method may be implemented by software and/or firmware, and can be performed by the wireless device or its equivalent. People of ordinary skill in the art can choose components or steps equivalent to those described in this specification to carry out the present disclosure, which means that the scope of this disclosure is not limited to the embodiments in the specification.

Figure 1A:
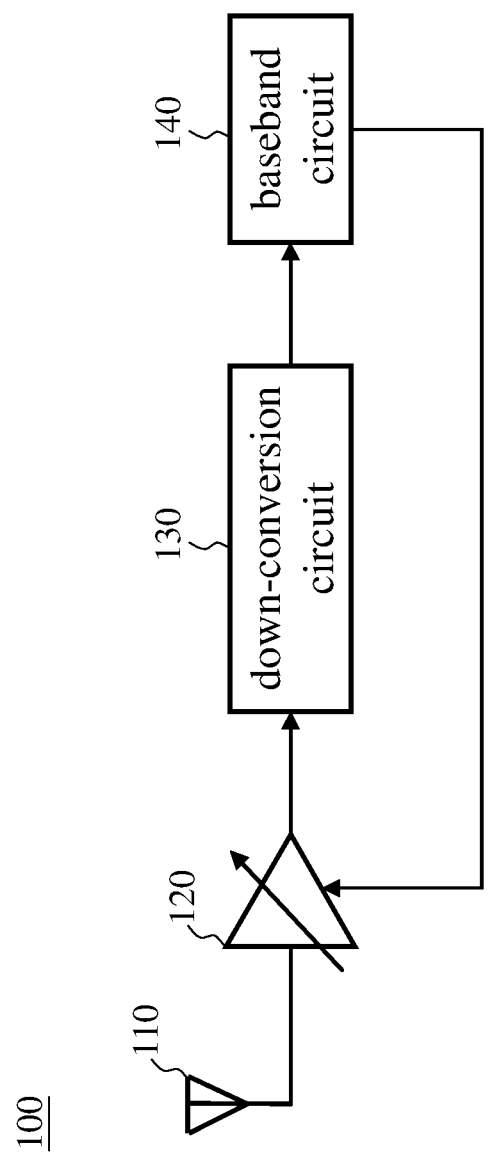
FIGS. 1A and 1B show a partial functional block diagram of a receiving end of a wireless device according to this disclosure.
Figure 1B:
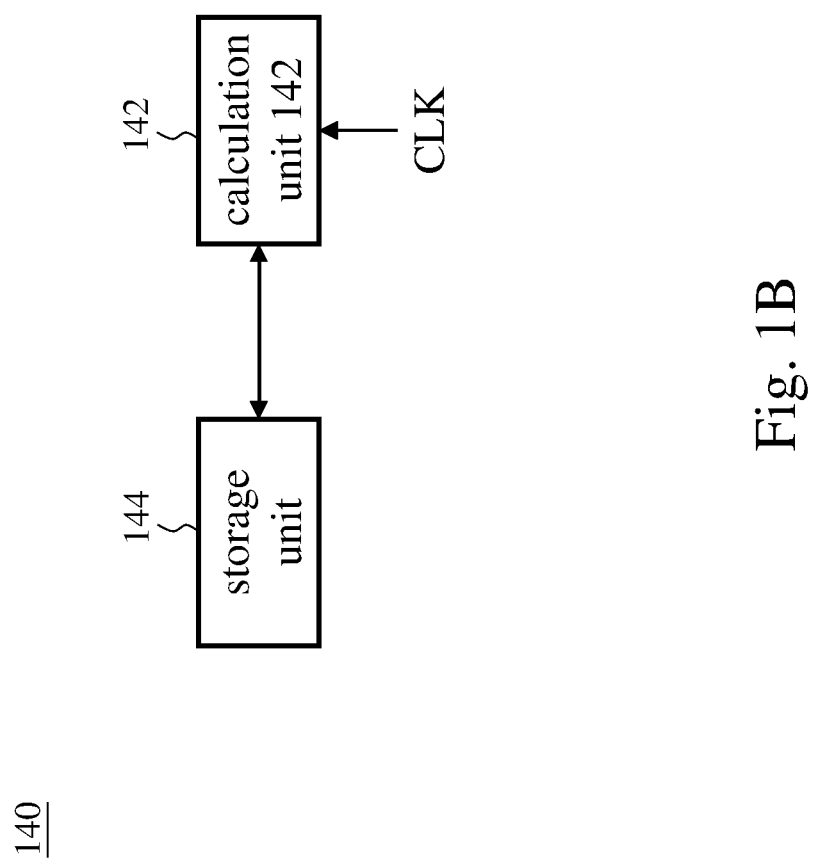
Figure 2:
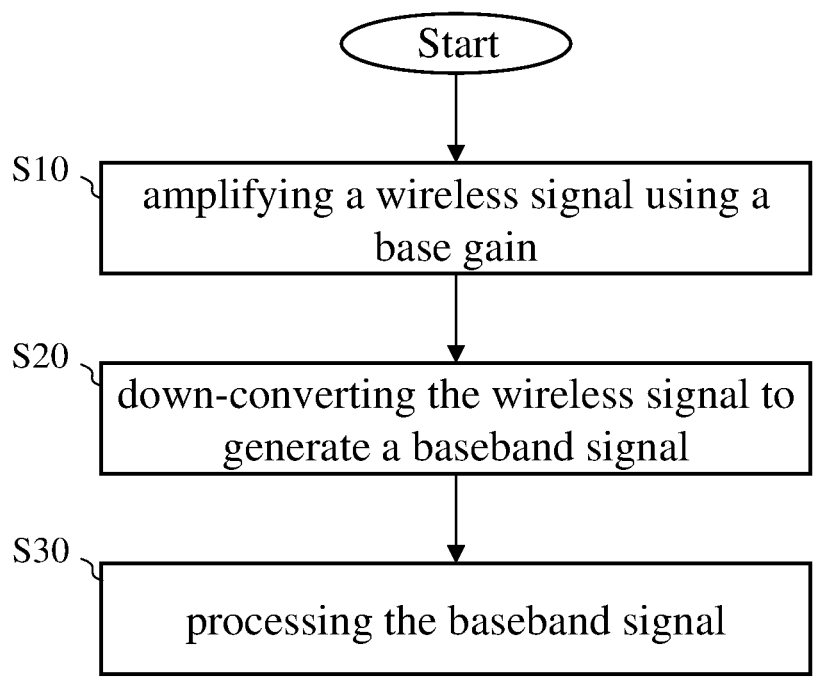
FIG. 2 illustrates a flowchart of a wireless signal processing method according to this disclosure

FIGS. 1A and 1B show a partial functional block diagram of a receiving end of a wireless device according to this disclosure, and FIG. 2 is a flowchart of a wireless signal processing method according to this disclosure. The wireless device 100 includes an antenna 110, an amplifier circuit 120, a down-conversion circuit 130, and a baseband circuit 140. The baseband circuit 140 includes a calculation unit 142 (e.g., a microprocessor, a central processing unit, and/or a micro control unit) having program execution capabilities, and a storage unit 144 (e.g., a dynamic random access memory, and/or a nonvolatile memory) storing a set of program instructions. The program instructions can be in the form of firmware or driver. The wireless device 100 receives a wireless signal through the antenna 110. The amplifier circuit 120 amplifies the wireless signal entering the wireless device 100 using a base gain (step S10), and then the down-conversion circuit 130 down-converts the wireless signal to generate a baseband signal (step S20). The baseband circuit 140 then processes the baseband signal (e.g., packet detection, demodulation, and/or decoding) to obtain the data carried by the packets of the wireless signal (step S30). The amplifier circuit 120 may include multiple amplification stages connected in series, and the magnification or gain of at least one of the amplification stages is adjustable.

Steps S10 and S20 process radio frequency signals, and step S30 processes baseband signals. The baseband circuit 140 may set or control the base gain by, for example, changing the register values of the registers. In other words, by setting or controlling the base gain, the baseband circuit 140 equivalently controls the amplifier circuit 120 to amplify the wireless signals according to the base gain. In some embodiments, the register value may, for example, be inversely proportional to the gain, but is not limited thereto.

In general, the base gain is inversely proportional to the signal strength of the wireless signal. For instance, when the signal strength of the wireless signal is low, the base gain is set high so that the wireless device 100 uses a greater gain to amplify the wireless signal whose signal strength is low, and thus the wireless device 100 can then perform subsequent processes on the amplified wireless signal. On the contrary, when the signal strength of the wireless signal is high, the base gain is set low. As can be seen, a base gain may correspond to a signal strength of the wireless signal. More specifically, the base gain may determine the minimum energy of the wireless signal that the wireless device 100 can receive. For example, when the base gain is set as G dB, the corresponding signal strength is (X_sig) dB. Since the wireless device 100 itself has packet detection capability, when the base gain is set as G dB, the lowest signal detection strength (i.e., the minimum signal strength that the wireless device 100 can detect) of the wireless device 100 is X dB, where X=X_sig-Y. The magnitude of Y may depend on the packet detection capability of the wireless device 100. That is, the wireless device with stronger packet detection capability (i.e., with greater Y value) can detect lower signal strength under the same base gain (i.e., the same X_sig).

Figure 3:
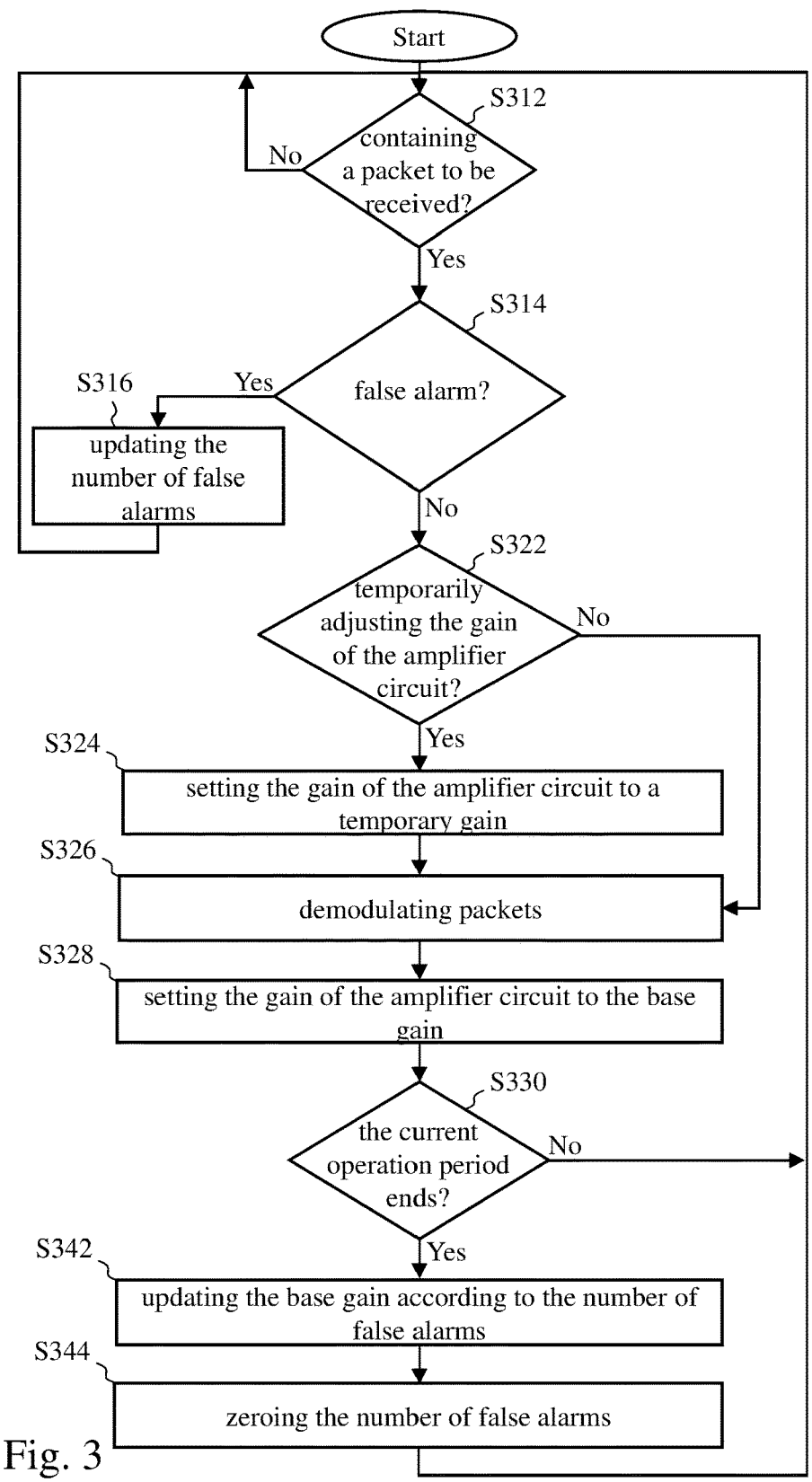
FIG. 3 illustrates detailed flowchart of the baseband signal processing step according to an embodiment of this disclosure.

FIG. 3 is a detailed flowchart of the baseband signal processing step (step S30 in FIG. 2) according to this disclosure. After receiving the baseband signal, the baseband circuit 140 performs packet detections on the baseband signal to detect whether the radio signal entering the wireless device 100 contains the packet to be received (step S312). For example, this determination can be conducted by performing a correlation operation. When the detection result is negative (i.e., no packets to be received), the baseband circuit 140 performs packet detections on the subsequent incoming baseband signals (step S312); when the detection result is positive, the baseband circuit 140 determines whether that packet to be received triggers a false alarm (step S314). When the determination result in step S314 is positive, which means the baseband circuit 140 cannot process or identify the packet to be received (i.e., the packet to be received is not an authentic packet), the baseband circuit 140 updates the number of false alarms (step S316). The number of false alarms is, for example, a count value stored in the storage unit 144. After completing step S316, the baseband circuit 140 goes back to step S312 to perform packet detections on the subsequent incoming baseband signals.

When the determination result in step S314 is negative, the baseband circuit 140 enters a demodulation process to demodulate the packet. Since the signal strength varies from signal to signal in the environment where the wireless device 100 is present (more specifically, the signal strength is associated with the distance between the wireless device 100 and the source wireless device that transmits the wireless signal, and with the emissive power which the source wireless device employs to transmit the wireless signal), the wireless signal that has been amplified using the base gain may have a too strong or too weak signal strength to the baseband circuit 140. In other words, the baseband circuit 140 may need to temporarily adjust the gain of the amplifier circuit 120 to avoid signal clipping or insufficient signal resolution. When the determination result of whether to temporarily adjust the gain of the amplifier circuit 120 (step S322) is positive, the baseband circuit 140 sets the gain of the amplifier circuit 120 to a temporary gain (step S324).

This temporary gain adjustment can be achieved by, for example, conventional automatic gain control (AGC) technology. When the determination result of step S322 is negative or when step S324 is complete, the baseband circuit 140 demodulates the packet (step S326). After the demodulation process is complete, the baseband circuit 140 controls the gain of the amplifier circuit 120 to be restored to the gain prior to the temporary gain (i.e., restoring the gain of the amplifier circuit 120 to the base gain) (step S328), and then determines whether the current operation period ends (step S330). Step S330 may be determined by the calculation unit 142 based on the system clock CLK of the wireless device 100. When the determination result of step S330 is negative, the baseband circuit 140 goes back to step S312; when the determination result of step S330 is positive (i.e., the current operation period ends and the baseband circuit 140 enters the next operation period), the baseband circuit 140 enters the base gain updating process.

In the base gain updating process, the baseband circuit 140 updates the base gain according to the number of false alarms (step S342), and then zeroes or resets the number of false alarms (step S344). After the base gain is updated, the amplifier circuit 120 amplifies the wireless signal with the updated base gain in a subsequent operation period; in other words, the number of false alarms in the current operation period determines the value of the base gain for the next operation period. After step S344 is completed, the baseband circuit 140 goes back to step S312.

Figure 4:
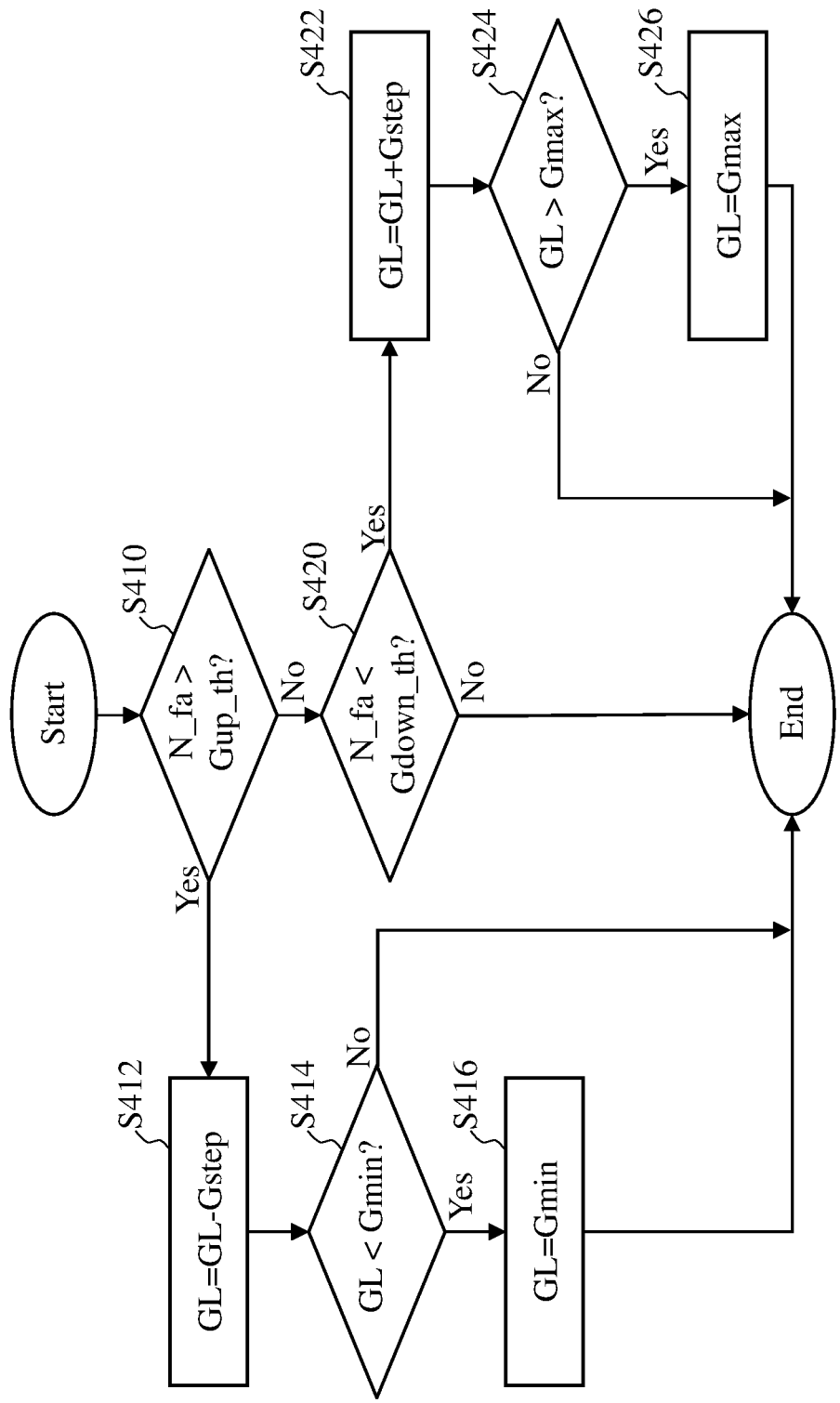
FIG. 4 illustrates a flowchart of the base gain updating mechanism according to an embodiment of this disclosure.

FIG. 4 is a flowchart of the base gain updating mechanism according to an embodiment of this disclosure. FIG. 4 is the detailed flow of step S342 in FIG. 3, and this flow starts after an operation period ends. The baseband circuit 140 first determines whether the number of false alarms N_fa is greater than a threshold value Gup_th (step S410). When the determination result of step S410 is positive, which means that the base gain value GL is too large, the baseband circuit 140 decreases the base gain value GL by a step value Gstep (Step S412), and then determines whether the resulting base gain value GL is smaller than the lower limit Gmin of the base gain (step S414). When the determination result of step S414 is positive, the base gain value GL is set as the lower limit Gmin of the base gain (step S416). When the determination result of S410 is negative, the baseband circuit 140 further determines whether the number of false alarms N_fa is smaller than a threshold value Gdown_th (step S420). The threshold value Gdown_th is smaller than or equal to the threshold value Gup_th. When the determination result of step S420 is negative, the base gain value GL is not required to be adjusted. When the determination result of step S420 is positive, which means that the base gain value GL is too small, the baseband circuit 140 increases the base gain GL by the step value Gstep (step S422) and then determines whether the resulting base gain value GL is greater than the upper limit Gmax of the base gain (step S424). When the determination result of step S424 is positive, the gain value GL is set as the upper limit Gmax of the base gain (step S426).

Figure 9:
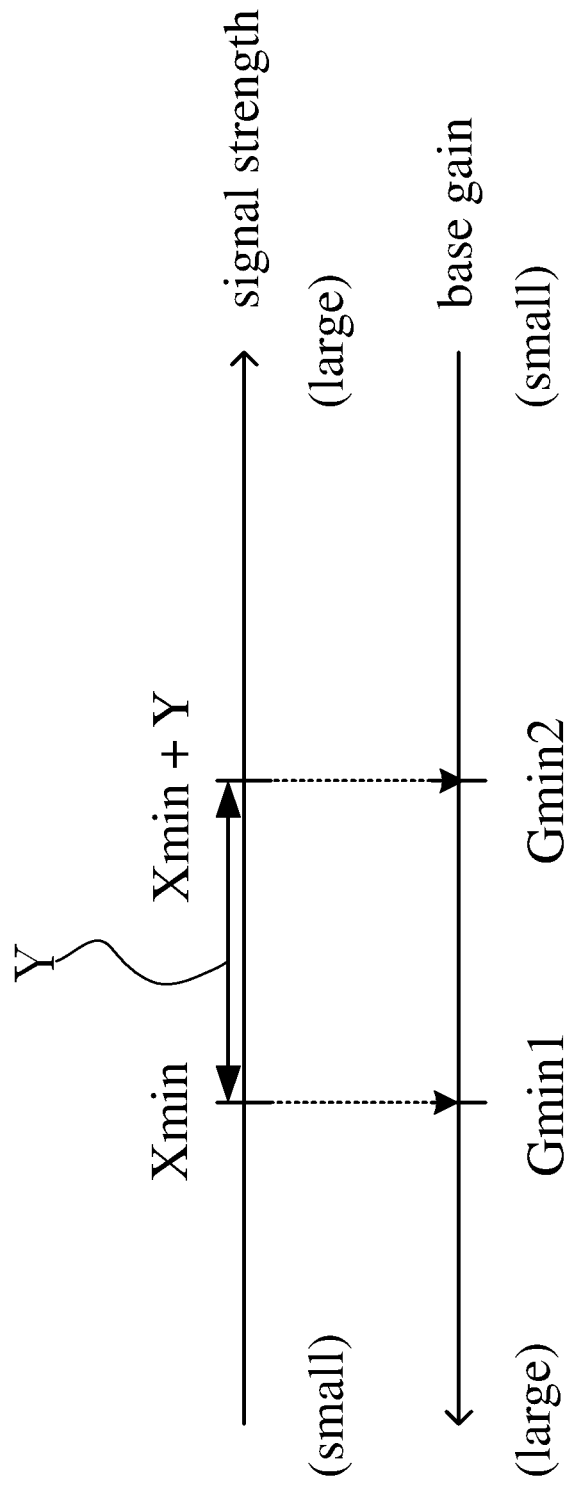
FIG. 9 illustrates the setting of a lower limit of the base gain according to this disclosure.

The threshold value Gup_th is associated with the tolerance of the wireless device 100 to the number of false alarms. The threshold value Gdown_th is associated with the probability of packet misdetection. Both threshold values can be set according to the current environment of the wireless device 100 and experience. The step value Gstep is associated with the adjustment capability of the amplifier circuit 120. In some embodiments, the step value Gstep can be set as the minimum unit (e.g., 1 dB) based on which the amplifier circuit 120 adjusts the gain. The lower limit Gmin of the base gain is associated with the energy of signals from the source wireless device that has established a connection with the wireless device 100 (i.e., the device that transmits wireless signals to the wireless device 100). In some embodiments, as shown in FIG. 9, the lower limit Gmin of the base gain may be set as (1) the base gain Gmin1 corresponding to the minimum signal strength (Xmin dB) generated as the source wireless device transmits signals to the wireless device 100, or (2) the base gain Gmin2 corresponding to the signal strength (Xmin+Y) dB, where the magnitude of Y may be determined according to the packet detection capability of the wireless device 100. In this way, the setting rule for the lower limit Gmin ensures that the adjustment of the base gain does not cause the source wireless device that has been connected to lose connection. The upper limit Gmax of the base gain is associated with the original hardware design of the wireless device 100 and is determined according to the type of signals received by the wireless device 100.

Figure 5:
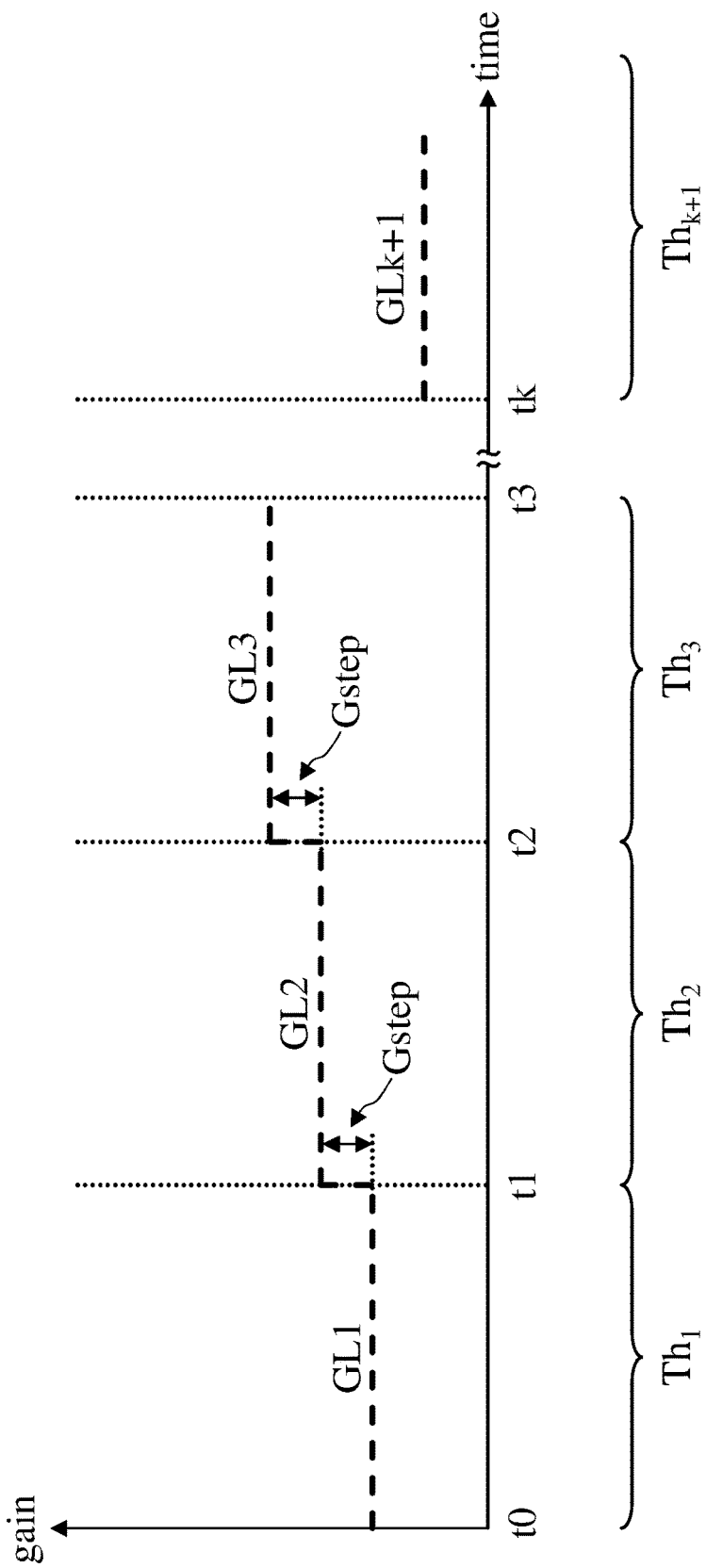
FIG. 5 illustrates an exemplary gain-time relationship when the base gain of the wireless device varies with time.

As discussed above, the baseband circuit 140 controls the amplifier circuit 120 to amplify, with different base gains in different operating periods, the wireless signals entering the wireless device 100. FIG. 5 shows an exemplary gain-time relationship when the base gain of the wireless device 100 varies with time. As shown in FIG. 5, the baseband circuit 140 sets the base gain of the wireless device 100 as gain values GL1, GL2, and GL3 during the first operation period (time t0 to t1), the second operation period (time t1 to t2), and the third operation period (time t2 to t3), respectively. As mentioned above, the amplifier circuit 120 includes multiple amplification stages, and the baseband circuit 140 changes the gain value by adjusting the magnification or gain of at least one of the amplification stages. The flowcharts of FIGS. 2 and 3 indicate that, after received by the wireless device 100, the wireless signals must undergo the amplification phase (step S10) and the down-conversion phase (step S20) prior to the packet detection process (steps S312 to S316). In this disclosure, the number of wireless signals entering the wireless device 100 is controlled by a signal strength range according to which the wireless device 100 receives signals, and the signal strength range is determined by dynamically adjusting the base gain in the radio frequency domain (i.e., prior to the packet detection process). Furthermore, as the adjustment of the base gain is associated with the number of false alarms, the number of false alarms can be controlled within a desired range while effectively suppressing packet misdetection. As the foregoing filtering mechanism is implemented in the radio frequency domain rather than the baseband domain, the disclosure can be applied to a variety of signal transmission technologies and physical layer technologies. The length of each operation period can be the same (i.e., $Th_1=Th_2=Th_3=Th_{k+1}$) or different (i.e., $Th_1$, $Th_2$, $Th_3$, and $Th_{k+1}$ are not all the same), and the longer the length Th of the operation period, the greater the corresponding threshold values Gup_th and Gdown_th can be set.

Figure 6:
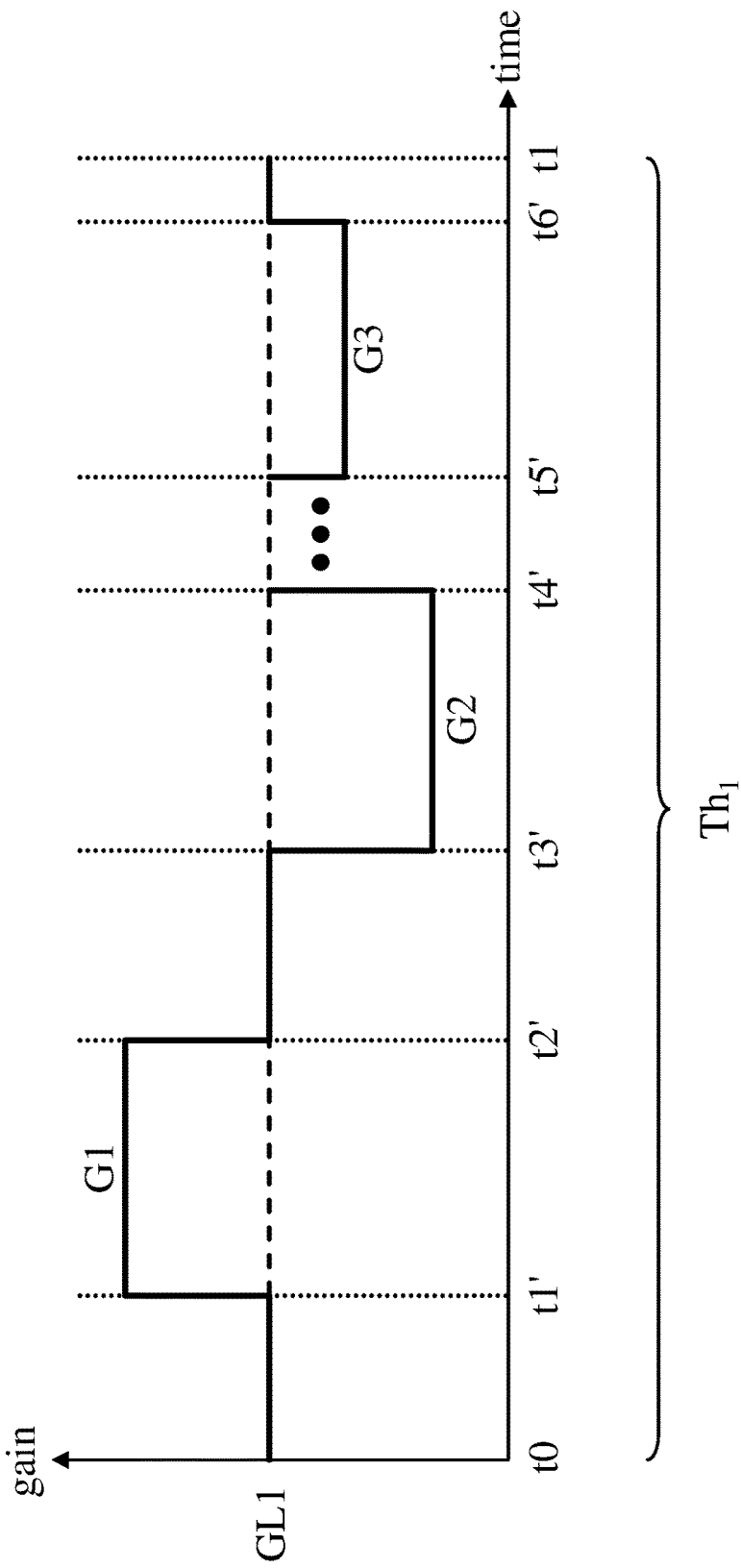
FIG. 6 illustrates an example of the gain variation of the amplifier circuit in one operation period of FIG. 5.

FIG. 6 is an illustrative example of the gain variation of the amplifier circuit 120 in one operation period (the first one is herein taken as an example) of FIG. 5. As shown in FIG. 6, the baseband circuit 140 sets the base gain of the wireless device 100 in the first operation period as the gain value GL1 (indicated by the horizontal broken line); therefore, in step S10 the amplifier circuit 120 amplifies the wireless signals according to the gain value GL1. In this operation period, the baseband circuit 140 performs one or more packet detection operations (steps S312 to S316), demodulation operations (steps S322 to S328), and base gain updating operations (steps S342 to S344). The time periods t1' to t2', t3' to t4', and t5' to t6' correspond to the demodulation operations, and at time points t1', t3', and t5' the baseband circuit 140 controls the amplifier circuit 120 to amplify wireless signals using temporary gains (with gain values G1, G2, and G3, respectively) (step S324). It should be noted that, after each demodulation operation is complete (step S326), the amplifier circuit 120 again uses the gain value GL1 of the base gain to amplify the wireless signals (step S328).

Figure 7:
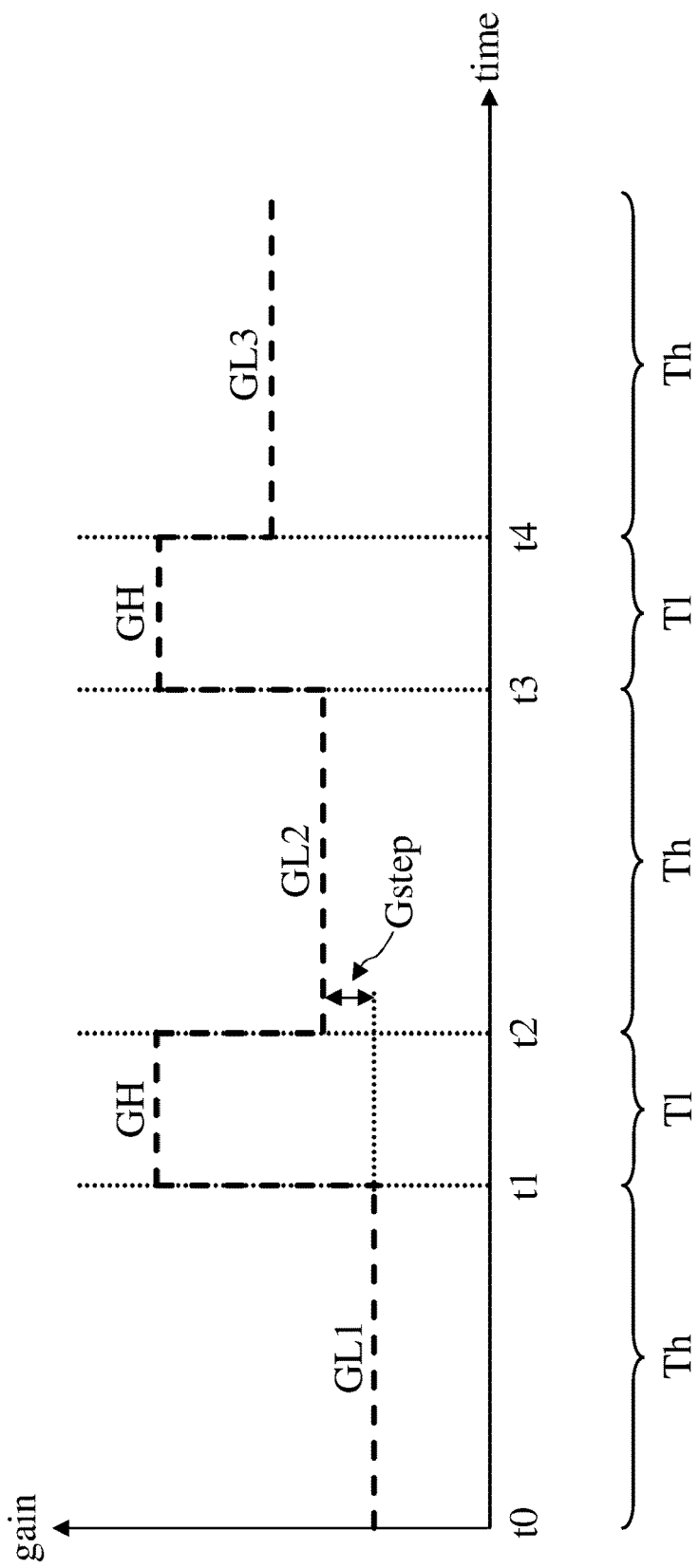
FIG. 7 illustrates an exemplary gain-time relationship according to another embodiment of this disclosure.

In other embodiments, in order for the wireless devices having different signal strengths to have the chance to establish a connection with the wireless device 100, the wireless device 100, in the operation of dynamically adjusting the base gain, increases the base gain timely to increase the signal coverage of the wireless device 100. FIG. 7 shows an exemplary gain-time relationship according to another embodiment of this disclosure. As shown in FIG. 7, the baseband circuit 140 sets the base gain as the gain values GL1 and GL2 in the first operation period (between time points t0 and t1) and the second operation period (between time points t2 and t3), respectively, and in a third operation period (between time points t1 and t2) between the first operation period and the second operation period the baseband circuit 140 sets the gain value of the base gain to GH. The gain value GH is greater than or equal to the gain value of an adjacent operation period; that is, GH≥GL1 and GH≥GL2 in this example. A greater gain value GH enables the wireless device 100 to provide a larger signal coverage, thereby increasing the probability that the wireless device having a weak signal strength establishes a connection with the wireless device 100. The length Th of the operation period can be set to be less than the packet retransmission time of most of the source wireless devices. The packet retransmission time is a time period from a wireless device starting to retry a packet to dropping that packet. In other words, by increasing the base gain timely, this embodiment provides opportunities for a source wireless device that has not yet established a connection with the wireless device 100 and that is weak in signal strength (e.g., because of being far away from the wireless device 100) to establish a connection with the wireless device 100. As a result, the wireless device 100 being able to meet the QoS requirements for multiple users can be ensured. In some embodiments, the gain value GH is independent of the number of false alarms; for example, the gain value GH can be set as the upper limit Gmax of the base gain.

Figure 8:
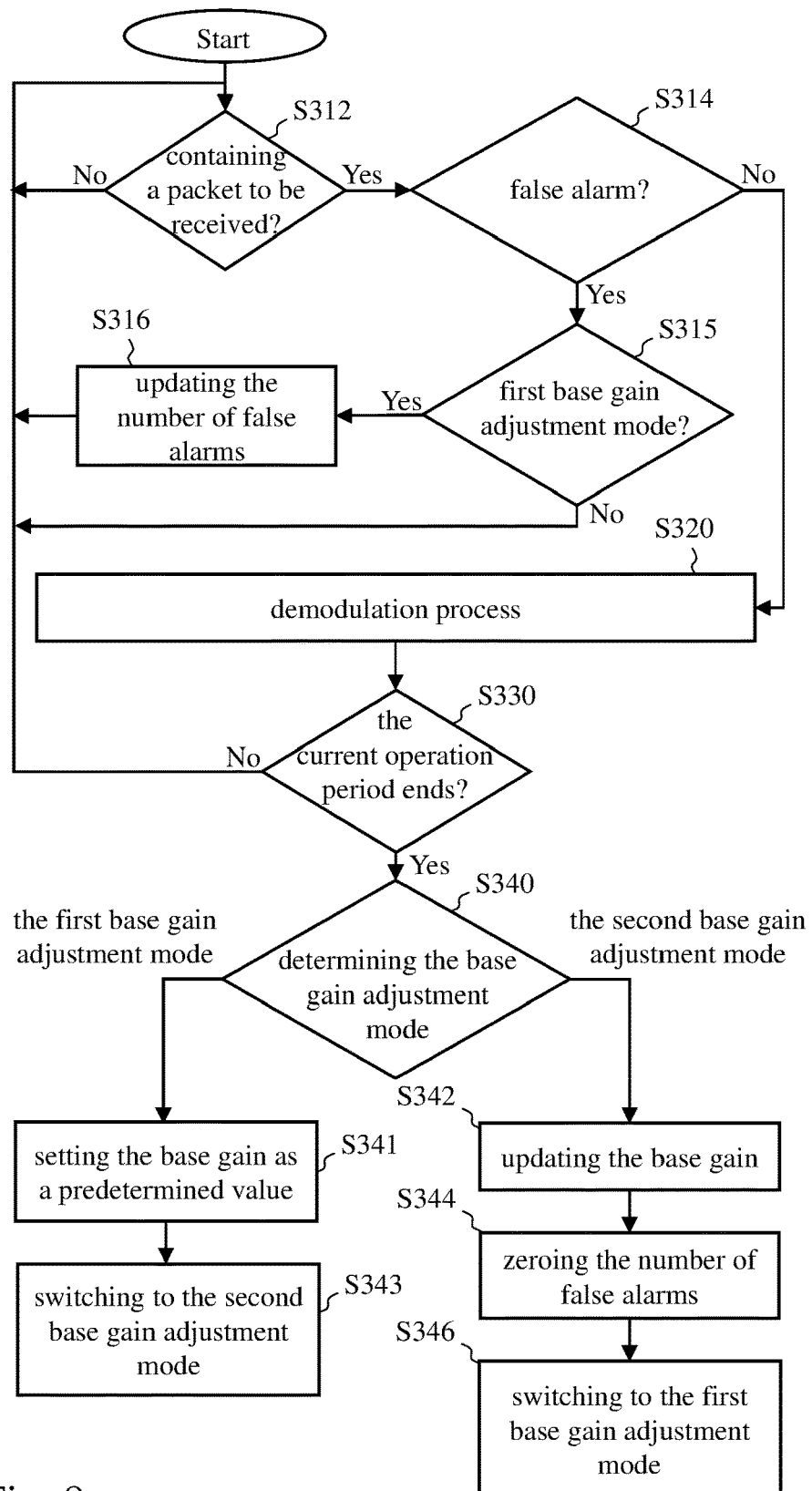
FIG. 8 illustrates detailed flowchart of the baseband signal processing step according to another embodiment of this disclosure.

In FIG. 7, the operation periods corresponding to the lower gain values (GLy with y being a positive integer) can be regarded as the first base gain adjustment mode, and the operation periods corresponding to the higher gain value (GH) may be regarded as the second base gain adjustment mode. The flowchart corresponding to this embodiment is shown in FIG. 8. The steps in FIG. 8 denoted by the same numbers as the steps in FIG. 3 perform the same operations, and the descriptions for these steps are omitted for brevity. In the packet detection process (steps S312 to S316), the number of false alarms is updated only when the current mode is the first base gain adjustment mode (i.e., when the determination result of step S315 is positive). The demodulation process of step S320 corresponds to steps S322 to S328 in FIG. 3. In the base gain updating process (steps S340 to S346), if the current base gain adjustment mode is the second base gain adjustment mode (implying that the next base gain adjustment mode is the first base gain adjustment mode), steps S342 and S344 are executed and then the mode is switched to the first base gain adjustment mode (step S346). If the current base gain adjustment mode is the first base gain adjustment mode (implying that the next base gain adjustment mode is the second base gain adjustment mode), the base gain is set as a predetermined value (e.g., the gain value GH) (step S341) and then the mode is switched to the second base gain adjustment mode (step S343).

In some embodiments, the wireless device 100 alternately operates in the first base gain adjustment mode and the second base gain adjustment mode; the duration Th of the first base gain adjustment mode is not constant and the duration T1 of the second base gain adjustment mode is not constant. In the embodiment of FIG. 7, the second base gain adjustment mode has the same gain value, but in other embodiments the second base gain adjustment mode may have a varying gain value. More specifically, in the embodiment of FIG. 7, the higher gain value GH is constant and is independent of the number of false alarms. In other embodiments, however, the higher gain value GH is not constant; for example, the higher gain value GH may be adjusted according to a flow similar to the one of FIG. 4 (i.e., the higher gain value GH is determined based on the number of false alarms in the previous second base gain adjustment mode). In some embodiments, the duration T1 is shorter than the duration Th, and to increase the chances that the packets can be correctly received, the duration T1 may be designed to be greater than or equal to at least twice the total time of one packet length plus one packet interval. The packet interval is, for example, a short interframe space (SIFS) defined in IEEE 802.11. Assuming that the packet length is p time units and the packet interval is q time units, then T1 can be designed to be greater than 2(p+q). In some embodiments, the number of base gain adjustment modes may be greater than two, where multiple base gain adjustment modes have different predetermined base gains.

The number of step values in FIG. 4 is not limited to one. For instance, the step value is Gstep1 for N_fa>Gup_th1, the step value is Gstep2 for Gup_th1>N_fa>Gup_th2, and Gstep1>Gstep2; thus, the gain adjustment speed can be enhanced. This disclosure can also reduce the circuit power consumption by lowering the base gain.

Since people of ordinary skill in the art can appreciate the implementation detail and the modification thereto of the present method embodiment(s) through the disclosure of the device embodiment(s), repeated and redundant description is thus omitted. Please note that there is no step sequence limitation for the method embodiment(s) as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A wireless signal processing method applied in a wireless device, the wireless device comprising an amplifier circuit that amplifies a wireless signal according to a base gain, and the method comprising:
   setting the base gain as a first gain value in a first operation period;
   performing a plurality of packet detection processes in the first operation period and counting a total number of false alarms;

determining a second gain value according to the total number of false alarms; and setting the base gain as the second gain value in a second operation period that is later than the first operation period.

2. The method of claim 1, wherein, the method further comprising:

setting the base gain as a third gain value in a third operation period;

wherein, the third operation period is between the first operation period and the second operation period, and the third gain value is independent of the total number of the false alarms and greater than or equal to the first gain value and the second gain value.

3. The method of claim 2, wherein, the packet detection processes detect whether the wireless signal contains a packet to be received, the wireless signal is from a source wireless device that retries the transmission of the packet to be received within a packet retransmission time, and the length of the first operation period is less than the packet retransmission time.

4. The method of claim 2, wherein, the packet detection processes detect whether the wireless signal contains a packet to be received, and the length of the third operation period is greater than or equal to twice a sum of a packet length of the packet to be received plus a packet interval.

5. The method of claim 1, wherein, the first operation period and the second operation period have different lengths.

6. A wireless device receiving a wireless signal, comprising:

an amplifier circuit that amplifies the wireless signal according to a base gain;

a down-conversion circuit, coupled to the amplifier circuit, down-converting the wireless signal; and a baseband circuit, coupled to the amplifier circuit and the down-conversion circuit, comprising:

a storage unit storing a set of program instructions; and a computing unit, coupled to the storage unit, executing the set of program instructions to perform the following operations:

setting the base gain as a first gain value in a first operation period;

performing a plurality of packet detection processes in the first operation period and counting a total number of false alarms;

determining a second gain value according to the total number of false alarms; and setting the base gain as the second gain value in a second operation period that is later than the first operation period.

7. The wireless device of claim 6, wherein, the computing unit further executes the set of program instructions to perform the following operations:

setting the base gain as a third gain value in a third operation period;

wherein, the third operation period is between the first operation period and the second operation period, and the third gain value is independent of the total number of the false alarms and greater than or equal to the first gain value and the second gain value.

8. The wireless device of claim 7, wherein, the packet detection processes detect whether the wireless signal contains a packet to be received, the wireless signal is from a source wireless device that retries the transmission of the packet to be received within a packet retransmission time, and the length of the first operation period is less than the packet retransmission time.

9. The wireless device of claim 7, wherein, the packet detection processes detect whether the wireless signal contains a packet to be received, and the length of the third operation period is greater than or equal to twice a sum of a packet length of the packet to be received plus a packet interval.

10. The wireless device of claim 6, wherein, the first operation period and the second operation period have different lengths.

11. A wireless signal processing method applied in a wireless device, the method comprising:

setting a base gain as a first gain value in a first operation period;

amplifying a wireless signal according to the base gain before a packet detection process in the first operation period begins;

down-converting the wireless signal to generate a baseband signal;

performing the packet detection process on the baseband signal in the first operation period; and setting the base gain as a second gain value in a second operation period, wherein, the second gain value is not equal to the first gain value, the second operation period is later than the first operation period, and the base gain is utilized to amplify the wireless signal in the second operation period before another packet detection process in the second operation period begins.

12. The method of claim 11, wherein, the method further comprises:

counting a total number of false alarms in the first operation period; and determining the second gain value according to the total number of false alarms.

13. The method of claim 12, wherein, the method further comprises:

setting the base gain as a third gain value in a third operation period;

wherein, the third operation period is between the first operation period and the second operation period, and the third gain value is independent of the total number of the false alarms and greater than or equal to the first gain value and the second gain value.

14. The method of claim 13, wherein, the packet detection process detects whether the wireless signal contains a packet to be received, the wireless signal is from a source wireless device that retries the transmission of the packet to be received within a packet retransmission time, and the length of the first operation period is less than the packet retransmission time.

15. The method of claim 13, wherein, the packet detection process detects whether the wireless signal contains a packet to be received, and the length of the third operation period is greater than or equal to twice a sum of a packet length of the packet to be received plus a packet interval.

16. The method of claim 11, wherein, the first operation period and the second operation period have different lengths.

* * * * *